United States Patent [19]
Wetzel

[11] Patent Number: 6,011,294
[45] Date of Patent: *Jan. 4, 2000

[54] LOW COST CCD PACKAGING

[75] Inventor: Keith E. Wetzel, Leroy, N.Y.

[73] Assignee: Eastman Kodak Company, Rochester, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/629,180

[22] Filed: Apr. 8, 1996

[51] Int. Cl.[7] ...................... H01L 31/0203; H01L 23/495
[52] U.S. Cl. ........................... 257/434; 257/668; 257/680
[58] Field of Search ..................................... 257/433, 434, 257/680, 668

[56] References Cited

U.S. PATENT DOCUMENTS

| | | | |
|---|---|---|---|
| 3,714,370 | 1/1973 | Nixen et al. ............................... | 174/52 |
| 3,768,157 | 10/1973 | Buie ........................................... | 29/613 |
| 4,025,716 | 5/1977 | Morse ..................................... | 257/680 |
| 4,663,833 | 5/1987 | Tanaka ..................................... | 29/588 |
| 4,812,420 | 3/1989 | Matsuda et al. ......................... | 437/209 |
| 4,894,707 | 1/1990 | Yamawaki et al. ...................... | 357/74 |
| 4,990,719 | 2/1991 | Wright ..................................... | 257/680 |
| 5,072,284 | 12/1991 | Tamura et al. ........................... | 257/680 |
| 5,087,964 | 2/1992 | Hatta ....................................... | 257/433 |
| 5,122,861 | 6/1992 | Tamura et al. ........................... | 357/74 |
| 5,386,342 | 1/1995 | Rostoker ................................. | 257/668 |
| 5,550,398 | 8/1996 | Kocian et al. ........................... | 257/434 |
| 5,641,984 | 6/1997 | Aftergut et al. ......................... | 357/433 |

FOREIGN PATENT DOCUMENTS

| | | | |
|---|---|---|---|
| 402016757 | 1/1990 | Japan ..................................... | 257/680 |
| 402030181 | 1/1990 | Japan ..................................... | 257/434 |
| 404146653 | 5/1992 | Japan ..................................... | 257/680 |
| 405251675 | 9/1993 | Japan ..................................... | 257/434 |
| 405267628 | 10/1993 | Japan ..................................... | 257/680 |
| 405275720 | 10/1993 | Japan ..................................... | 257/680 |
| WO 93/13562 | 7/1993 | WIPO ..................................... | 257/680 |

*Primary Examiner*—Ngân V. Ngô
*Attorney, Agent, or Firm*—James D. Leimbach

[57] ABSTRACT

A packaging solution for CCD devices and other opto-electronic applications that offers a lower cost, automated assembly process. A package made of a moldable plastic material with low moisture permeability, and high dimensional stability by employing materials such as liquid crystal polymer. While relatively high cost plastic materials may be used, the overall cost is expected to be substantially lower than a corresponding ceramic package. An interconnect circuit pattern is then be formed on the plastic using one of a variety of plating options known in the circuit board, and in the molded interconnect industry. The ability to mold a flexible circuits into the package results from the use of these materials. Conductors of standard materials in the circuit board industry; e.g., copper with selective nickel and gold plating are employed on a non reflective substrate surface. The CCD sensor is mounted to this plastic substrate and connected to the conductive pattern using standard wire bonding processes. In order to support a transparent cover glass which protects the CCD sensor, a supporting ring frame can be molded into the plastic. This support ring would surround the CCD sensor, and provide a means of supporting the cover glass. The plastic substrate would then be interconnected to the external world via the integral flexible circuit. Standard zero insertion flexible circuit connectors would be the preferred method of connecting the flexible circuit to the system electronics. The use of anisotropic adhesives or traditional butt joint soldering techniques might also be used depending upon the application.

13 Claims, 1 Drawing Sheet

LOW COST CCD PACKAGING

FIELD OF INVENTION

The invention relates generally to the field of electronic packaging, and more particularly, to packaging specific to charge coupled devices.

BACKGROUND OF THE INVENTION

Currently, most charge coupled devices (CCD) sensors are packaged in multilayer high temperature cofired ceramic dual-in-line packages. Multilayer ceramic packages have traditionally been used for the packaging of power devices or UV erasable memories. With the advent of Camcorders, and fax machines, the multilayer ceramic dual-in-line package has been extended to the packaging of low end charge coupled devices. The multilayer ceramic structure has many advantages when packaging CCDs. Multilayer ceramic dual-in-line (DIP) packages have the following desirable properties: 1) low moisture permeability; 2) high dimensional stability; 3) a temperature coefficient of expansion closely matching silicon; 4) good thermal conductivity; 5) infrastructure is in place for high volume manufacturing; and 6) testability;

The major disadvantages of the ceramic dual-in-line package is the cost, and to a lesser extent, the obsolescence issues surrounding the integrated circuit packaging industry moves away from dual-in-line package and toward surface mount technology.

Another key disadvantage concerns the alignment of the CCD to the imaging and viewfinder optics; as one finds in digital cameras. The alignment of the CCD to the lens system requires that the CCD be precisely positioned to the optical axis, and the focal plane of the lens. Unfortunately, the positional variability associated with the location of the dual-in-line package pins is so large that it is impractical to use these pins as mechanical reference to the CCD device. Consequently, other reference datums must be created. The dual-in-line package pins then become an additional mechanical constraint on the mechanical design. The pins while compliant are sufficiently rigid to require that additional compliance be added to the mechanical design of the system. Flexible circuits are often used to overcome the mechanical constraints imposed by the dual-in-line package pins. Typically, the flexible circuit is connected directly to the dual-in-line package. In other cases, the dual-in-line package is mounted to a circuit board, and the circuit board is then connected to the system electronics with a flexible interconnect.

Still another disadvantage of the dual-in-line package is the inability to automate the assembly of the CCD device into the product level assembly. The temperature sensitivity of the charge coupled device means that standard automated electronic assembly techniques; such as, solder reflow ovens, or wave-soldering can not be used when assembling the dual-in-line package to the system electronics. Often, a hand-soldering operation is required to interconnect the dual-in-line package to the system electronics. Elimination of the need to hand solder these connections increases the quality of the entire system.

As can be seen from the foregoing description, there remains a need within the art for a CCD packaging that can cure the previously discussed problems within the prior art.

SUMMARY OF THE INVENTION

The present invention is directed to overcoming one or more of the problems set forth above. Briefly summarized, according to one aspect of the present invention, a packaging structure for an image sensor is provided for comprising a flexible circuit board having a substrate with a plurality of conductors formed, thereon; a base structure fixedly attached to a first side of the flexible circuit board; a ring frame molded to having a cavity formed within the ring frame to house the image sensor, the ring frame being fixedly attached to a second side of the flexible circuit board such that electrical connectors on the image sensor can be juxtapositioned to make electrical contact with the electrical conductors on the flexible circuit board by placing the image sensor within the cavity in a predetermined position; and a cover glass fixedly attached to the ring frame.

The present invention addresses the packaging cost issue and offers the potential for a lower cost, automated assembly process. It is extendible not only to CCD devices, but would be useful in other opto-electronic applications. A moldable plastic material with low moisture permeability, and high dimensional stability; such as, a liquid crystal polymer, could be used to achieve performance similar to ceramic but at lower cost. While relatively high cost plastic materials may be used, the overall cost is expected to be substantially lower than a corresponding ceramic package. An interconnect circuit pattern could then be formed on the plastic using one of a variety of plating options known in the circuit board, and in the molded interconnect industry.

The present invention is employs a flexible circuit into the package. These conductors would likely consist of standard conductor materials well known in the circuit board industry; e.g., copper with selective nickel and gold plating. A non reflective substrate surface would be preferred. The CCD sensor would be mounted to this plastic substrate and connected to the conductive pattern using standard wire bonding processes.

In order to support a transparent cover glass which protects the CCD sensor, a supporting ring frame would be molded into the plastic. This support ring would surround the CCD sensor, and provide a means of supporting the cover glass. The plastic substrate would then be interconnected to the external world via the integral flexible circuit. Standard zero insertion flexible circuit connectors would be the preferred method of connecting the flexible circuit to the system electronics. The use of anisotropic adhesives or traditional butt joint soldering techniques might also be used depending upon the application.

The above and other objects of the present invention will become more apparent when taken in conjunction with the following description and drawings wherein identical reference numerals have been used, where possible, to designate identical elements that are common to the figures.

Advantageous Effect of the Invention

The present invention has the following advantages: it eliminates the need for sockets used in mounting CCDs and image sensors in general; potentially lower manufacturing costs; ease of assembly because alignment to the optical system is simpler by usage of a flexible circuit board; the combination of flexible circuit board with a socketless mounting creates a mounting package that is smaller in size and more versatile in assembly; and it allows for a subassembly that can house additional components closer to the image sensing device resulting in higher frequency operation.

BRIEF DESCRIPTION OF THE DRAWINGS

FIG. 1b is a top view of the packaging structure shown in FIG. 1a.

DETAILED DESCRIPTION OF THE INVENTION

The preferred embodiment offers a solution to the previously discussed problems within the prior art by addressing the packaging cost issue and, furthermore, offers the potential for a lower cost, automated assembly process. While the preferred embodiment relates to packaging of CCD devices, it is envisioned that the present invention be extendible to other opto-electronic applications.

Figure 1A:
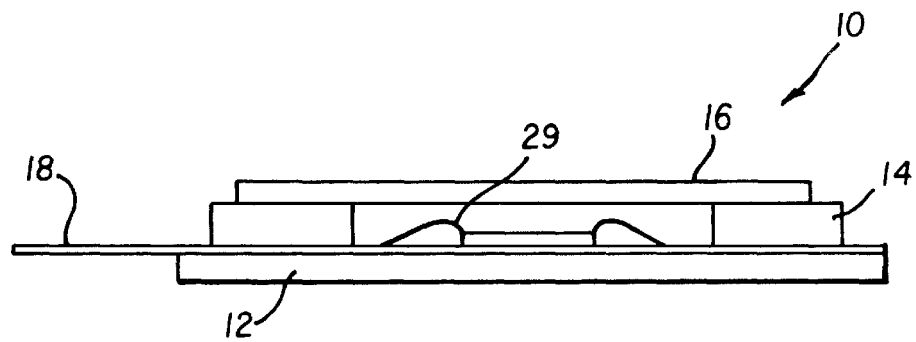
FIG. 1a is a side view of the plastic CCD packaging structure envisioned by the present invention.

Referring to FIG. 1a a side view of the plastic CCD packaging structure, generally referred to as 10, as envisioned by the preferred embodiment of the present invention can be seen. The invention as seen in FIG. 1a comprises a plastic base structure 12 for support beneath a flexible circuit board 18. Electrical conductors are formed upon flexible circuit board 18. Plastic ring frame 14 is placed on top of the flexible circuit board 18 creating a sandwich area defined by the base structure 12 and plastic ring frame 14 with flexible circuit 18 in between. The plastic ring frame 14 provides depth for an image sensor to be contained therein. The image sensor electrical connectors that make electrical contact with conductor pattern on the flexible circuit 18. The ring frame 14 provides support for a cover glass 16 that provides isolation from ambient conditions for the enclosed CCD while allowing light to pass and become incident upon the CCD.

The preferred embodiment of the present invention involves a package made of three pieces of moldable plastic material with low moisture permeability, and high dimensional stability; such as, a liquid crystal polymer. The preferred embodiment employs the material to create the base 12, flexible circuit board 18 and the ring frame 14. However, it is also envisioned that different materials could be used interchangeably within the three components mentioned above. While relatively high cost plastic materials may be used, the overall cost is expected to be substantially lower than a corresponding ceramic package. An interconnect circuit pattern could then be formed on the plastic using one of a variety of plating options known in the circuit board, and in the molded interconnect industry.

Flexible circuit 18 is placed between into the package structure 10 between the ring frame 14 and base 12. This configuration yields the advantages of the present invention in terms of manufacturing and optical alignment procedures that solve the previously discussed problems of the prior art. The flexible circuit board 18 comprises a plurality of conductors 19 upon a plastic substrate surface 20. These conductors 19 would likely consist of standard conductor materials well known in the circuit board industry; e.g., copper with selective nickel and gold plating. A non reflective plastic surface would be preferred in creating substrate 20. However, other substrate materials may also be used as substrate 20. The CCD sensor would be mounted to this plastic substrate 20 and connected to the conductive pattern 19 using standard wire bonding processes to connect wire bond pads 29 to the CCD sensor. In this manner the CCD sensor then becomes surface mounted to the flexible circuit board 18.

The supporting ring frame has an open top area 24 and an open bottom area 34. This supporting ring frame 14 surrounds the CCD sensor, and provides a means of supporting the cover glass 16. In order to support a transparent cover glass 16 which protects the CCD sensor, the cover glass 16 would be attached to the top open area of ring frame 14 by any of numerous conventional means including but not limited to: adhesive; heat sealing; ultrasonic welding; or laser welding. The mode of attachement of the cover glass also provides sealing means that isolate the CCD from ambient conditions. The plastic base 12 provides support for the entire package assembly 10. The plastic base 12, the ring 14 and the cover glass 16 are assembled using a process similar to that described above for attaching the cover glass 16 to the ring frame 14 at the various interfaces. The embodiment shown in FIG. 1a illustrates a configuration where the flexible circuit board 18 has a smaller width than base 12. In this type of embodiment there is a recess (not shown) within the base structure 12 to contain the flexible circuit 18. Additional embodiments are envisioned whereby flexible circuit 18 has the same width as base 12 and ring frame 14 or at least wherein flexible circuit is as wide as the ring frame 14 to capture the flexible circuit on all sides. The conductors 19 on substrate 20 then interconnect the electrical connectors on the CCD to external electronic circuitry. Standard zero insertion flexible circuit connectors would be the preferred method of connecting the flexible circuit to the system electronics. The use of anisotropic adhesives or traditional butt joint soldering techniques might also be used depending upon the application.

Embodiments are envisioned whereby, flexible circuit board 18 is used to house additional electrical components. Multi-layered technology conventionally known would allow for dense packaging of device on flexible circuit board 18. Such a configuration would allow for circuits to be placed closer to the CCD 1 image sensor. This would provide for higher frequency operation and reduced capacitive loading because of the shorter conductive lead lines.

Figure 1B:
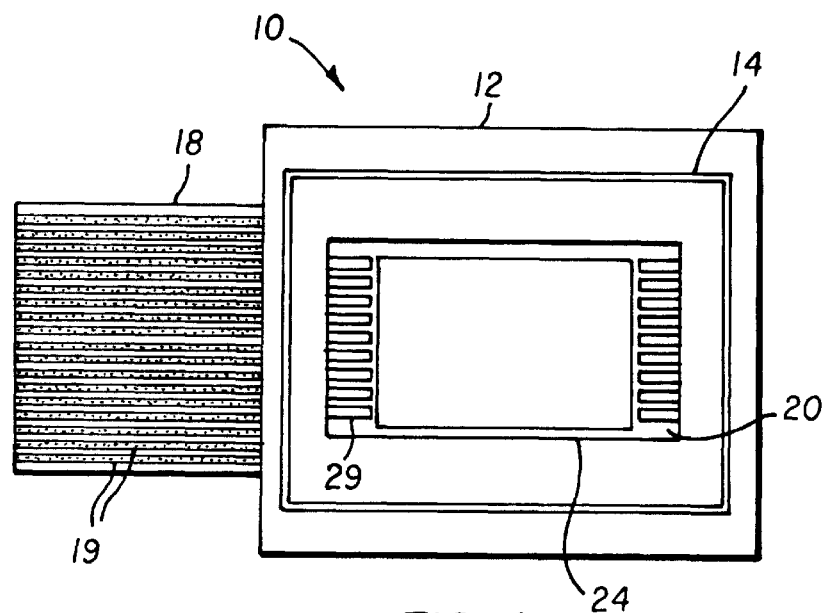
Figure 2:
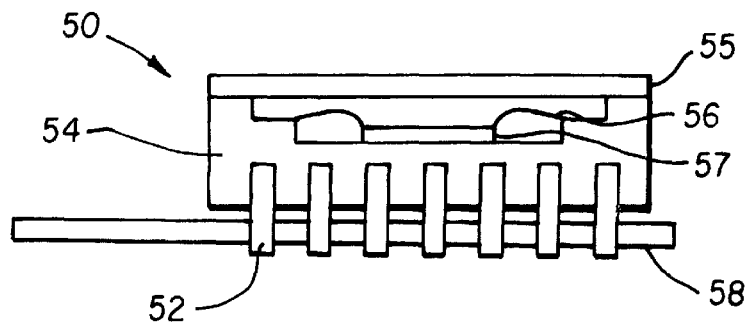
FIG. 2 is side view of a prior art packaging arrangement.

Referring now to prior art FIG. 2, in conjunction with FIG. 1a and FIG. 1b, the present invention eliminates the need for sockets used in mounting CCDs and image sensors in general. This is readily apparent when the prior art device in FIG. 2, generally referred to as 50, is compared to that present invention of FIG. 1a and FIG. 1b. The leads, or electrical connecting pins 52, on the device of FIG. 2 must be soldered or placed into a socket 52 which here is a multilayer ceramic package having CCD sensors 57 contained, therein, electrically connected to pins 52 via wirebond 56, the entire enclosure sealed with glass lid 55 and soldered to flexible circuit 58. The present invention in FIG. 1a and FIG. 1b thereby results in lower manufacturing costs. Additionally the ease by which package of the present invention is accomplished is significantly increased because alignment to the optical system is simpler by usage of a flexible circuit board. The combination of flexible circuit board with a socketless mounting creates a mounting package that is smaller in size and more versatile in assembly; and it allows for a sub-assembly that can house additional components closer to the image sensing device resulting in higher frequency operation. A more versatile assembly is achieved by the use of the flexible circuit board 18 because the flexible circuit board 18 can be bent with components attached to it, resulting in an assembly that can fit into very small spaces.

In the preferred embodiment the backside of the CCD, which is the side facing flexible circuit board 18, is attached to the flexible circuit board via an electrically conductive die pad. The die pad is a metalized area that provides a reference plane for grounding purposes. The front of the CCD contains electrical pads (not shown) for the interconnect of signals via wirebond to the flexible circuit 18. The wirebond pads can comprise, but are not limited to, copper with nickel plating followed by gold plating or other conventional conductive bonding pad material. The electrical connectors on the CCD are connected to the wirebond pads via conventional processes comprising but not limited to either thermosonic, gold ball or aluminum wedge.

The invention has been described with reference to a preferred embodiment. However, it will be appreciated that variations and modifications can be effected by a person of ordinary skill in the art without departing from the scope of the invention.

Parts List

1 CCD
10 CCD package structure
12 plastic base structure
14 plastic ring frame
16 cover glass
18 flexible circuit
19 plurality of conductors
20 substrate
24 top area of ring frame
29 wire bonds pads
34 bottom area of ring frame
50 prior art device
52 electric connecting pins
54 prior art socket
55 glass lid
56 wire bond
57 CCD sensor
58 flexible circuit

What is claimed is:

1. A packaging structure for an image sensor comprising:
    a flexible circuit board having a substrate having a first side and a second side with a plurality of conductors formed within the substrate;
    a conductive pattern formed on the second side of the substrate and electrically connected to the plurality of conductors;
    a base structure fixedly attached to the first side of the flexible circuit board;
    a ring frame molded to form a cavity within the ring frame to house the image sensor, the ring frame being fixedly attached to the second side of the flexible circuit board such that electrical connectors on the image sensor can be wirebonded to make electrical contact with the conductive pattern on the flexible circuit board by placing the image sensor within the cavity in a predetermined position; and
    a cover glass fixedly attached to the ring frame.

2. The invention of claim 1 wherein the flexible circuit board is a multi-layer circuit board.

3. The invention of claim 1 further comprising at least one additional electrical component mounted on the flexible circuit board.

4. The package of claim 1 wherein plastic is used to form the substrate of the flexible circuit board, the ring frame and the base.

5. The invention of claim 1 further comprising sealing means for creating a moisture proof environment for the image sensor contained within the cavity.

6. The invention of claim 1 wherein the ring frame and the base are a single operative unit connected together by a hinging mechanism.

7. A packaging structure for a charge coupled device (CCD) comprising:
    a flexible plastic circuit board having a substrate with a first side and a second side, with a plurality of conductors formed within the substrate and a conductive pattern formed on the second side of the flexible circuit board;
    a plastic base structure fixedly attached to a first side of the flexible circuit board;
    a plastic ring frame molded to form a cavity within the ring frame to house the CCD, the ring frame being fixedly attached to the second side of the flexible circuit board such that electrical connectors on the CCD are juxtaposition to make electrical contact with the electrical conductors on the flexible circuit board by placing the CCD within the cavity in a predetermined position;
    a cover glass fixedly attached to the ring frame;
    sealing means for creating a moisture proof environment for the image sensor contained within the cavity.

8. The invention of claim 7 wherein the plastic used to create the ring frame, the base and the substrate is a non-reflective plastic.

9. The invention of claim 8 wherein the non-reflective plastic is additionally a moldable plastic material with low moisture permeability.

10. The invention of claim 7 wherein the ring frame and the base are a single operative unit connected together by a hinging mechanism.

11. The invention of claim 7 wherein the flexible plastic circuit board has at least one additional component mount on it.

12. The invention of claim 7 wherein the flexible plastic circuit board is a multilayer board.

13. The invention of claim 12 wherein the multilayer board has at least one additional electrical circuit mount upon it.

* * * * *